United States Patent
Bachhofer et al.

(10) Patent No.: US 6,469,887 B2
(45) Date of Patent: Oct. 22, 2002

(54) CAPACITOR FOR SEMICONDUCTOR CONFIGURATION AND METHOD FOR FABRICATING A DIELECTRIC LAYER THEREFOR

(75) Inventors: Harald Bachhofer; Thomas Haneder, both of München; Reinhard Stengl, Stadtbergen; Wolfgang Hönlein, Unterhaching; Hans Reisinger, Grünwald, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/011,133

(22) Filed: Nov. 13, 2001

(65) Prior Publication Data
US 2002/0093781 A1 Jul. 18, 2002

Related U.S. Application Data

(63) Continuation of application No. PCT/DE00/01405, filed on May 4, 2000.

(30) Foreign Application Priority Data

May 12, 1999 (DE) .......................................... 199 22 180

(51) Int. Cl.$^7$ ................................................ H01G 4/06

(52) U.S. Cl. ......................... 361/312; 361/313; 361/311
(58) Field of Search ................................. 361/311, 312, 361/313, 321.2, 321.3, 321.4

(56) References Cited

U.S. PATENT DOCUMENTS

| 4,891,684 | A | | 1/1990 | Nishioka et al. |
| 5,195,018 | A | | 3/1993 | Kwon et al. |
| 5,895,946 | A | | 4/1999 | Hamamoto et al. |
| 6,090,723 | A | * | 7/2000 | Thakur et al. ............... 438/778 |
| 6,197,651 | B1 | * | 3/2001 | Shan .......................... 438/253 |
| 6,300,216 | B1 | * | 10/2001 | Shan ............................. 438/3 |

FOREIGN PATENT DOCUMENTS

JP   10107216 A   4/1998

OTHER PUBLICATIONS

International Search Report for PCT/DE00/01405, issued by the European Patent Office on Sep. 15, 2000.

* cited by examiner

Primary Examiner—Anthony Dinkins
(74) Attorney, Agent, or Firm—Laurence A. Greenberg; Werner H. Stemer; Ralph E. Locher

(57) ABSTRACT

A capacitor for a semiconductor configuration and a method for producing a dielectric layer for the capacitor. The dielectric layer consists of cerium oxide, zirconium oxide, hafnium oxide or various films of the materials.

8 Claims, 1 Drawing Sheet

CAPACITOR FOR SEMICONDUCTOR CONFIGURATION AND METHOD FOR FABRICATING A DIELECTRIC LAYER THEREFOR

CROSS-REFERENCE TO RELATED APPLICATIONS

This application is a continuation of copending International application No. PCT/DE00/01405, filed May 4, 2000, which designated the United States.

BACKGROUND OF THE INVENTION

Field of the Invention

The present invention relates to a capacitor for a semiconductor configuration having a dielectric layer that is provided between two electrodes, and to a method for fabricating this dielectric layer.

DRAMs (Dynamic Random Access Memories) in silicon process technology currently primarily use storage capacitors having a dielectric layer consisting of silicon nitride ($Si_3N_4$) and/or silicon dioxide ($SiO_2$). These NO (nitride/oxide) layers are very widespread and are in very general use as dielectrics for storage capacitors.

A certain drawback of using NO layers as dielectrics is their limited scalability. Therefore, for some time there has been a demand for other materials that can be used for the dielectric layers of capacitors, in order to achieve higher specific capacitances, i.e. capacitances per unit area, using these other materials. Examples of such materials are tantalum pentoxide ($Ta_2O_5$) and titanium dioxide ($TiO_2$), which are distinguished by high dielectric constants. Because of these high dielectric constants, it is possible to use tantalum pentoxide and titanium dioxide to achieve reduced NO-equivalent thickness and therefore a higher specific capacitance.

Particularly in the case of DRAM fabrication, there is a need for a dielectric layer that makes it possible to achieve a specific capacitance which is significantly higher than that of NO and that can readily be integrated with the silicon process technology employed in the fabrication of DRAMs. Such materials for dielectric layers should also be distinguished by a low defect density, a high breakdown field strength (of the order of magnitude of up to 10 MV/cm and higher), lower leakage currents, high relative dielectric constants of over 20, and should have low NO-equivalent thickness.

SUMMARY OF THE INVENTION

It is accordingly an object of the invention to provide a capacitor for a semiconductor configuration and a method of producing the dielectric layer for such a capacitor, which overcome the above-mentioned disadvantages of the prior art apparatus and methods of this general type. In particular, it is an object of the invention to provide a capacitor for a semiconductor configuration, in which the dielectric layer of the capacitor makes it possible to achieve high specific capacitances and which can be integrated with silicon process technology.

With the foregoing and other objects in view there is provided, in accordance with the invention, a capacitor for a semiconductor configuration that includes two electrodes and a dielectric layer located between the two electrodes. The dielectric layer is made of an amount of a material consisting of cerium oxide, zirconium oxide, or hafnium oxide. A small amount of yttrium, relative to the amount of the material of the dielectric layer, is added to stabilize the material of the dielectric layer.

The object of the invention is achieved by the fact that the dielectric layer consists of cerium oxide ($CeO_2$), zirconium oxide ($ZrO_2$), or hafnium oxide ($HfO_2$).

With the foregoing and other objects in view there is also provided, in accordance with the invention, a method for fabricating a dielectric layer of this type by sputtering from a target, by a CVD process with precursors, or by spin-on (centrifugal application). The precursors used are in particular zirconium dimethyl dibutoxide ($C_{20}H_{44}O_4Zr$), $Ce(thd)_4$, cerium dimethoxyethoxide in methoxyethanol ($Ce(OCH_2CH_2OCH_3)_3$) or zirconium diethylhexanoate ($Zr(OOCC_7H_{15})_4$).

In accordance with an added feature of the invention, if appropriate, the dielectric layer may be composed of a plurality of films which each consist of cerium oxide, zirconium oxide, or hafnium oxide. It is also possible to provide silicon nitride for one of these films. A preferred thickness for a silicon nitride film of this type in the dielectric layer is approximately 1 to 3 nm.

The cerium oxide, zirconium oxide, or hafnium oxide of the dielectric layer can be stabilized by yttrium. Even a small amount of added yttrium is sufficient. To reduce bulk defects and to improve the interface—if silicon is used as an electrode material—the oxides may moreover be doped with, for example, silicon or aluminum.

In accordance with an additional feature of the invention, the electrodes of the capacitor preferably consist of silicon, for example polycrystalline, doped silicon. This is possible because cerium oxide, zirconium oxide, and hafnium oxide have a high enthalpy of formation. Using silicon as an electrode material is particularly advantageous if the capacitor is used in a DRAM and deep trenches are provided for this purpose. The dielectric layer of the capacitor is applied to silicon in the trench.

Cerium oxide, zirconium oxide and hafnium oxide can be fabricated by sputtering from a target, using a CVD (Chemical Vapor Deposition) process and corresponding precursors, or using a spin-on (or centrifugal) method from a specific precursor for this type of deposition. Subsequent conditioning steps depend on the type of deposition, the type of material, i.e. cerium oxide, zirconium oxide, or hafnium oxide, the layer thickness, and the desired properties. However, the conditioning steps preferably take place in an oxygen atmosphere and at temperatures of 500 to 800° C.

As tests have demonstrated, dielectric layers including cerium oxide, zirconium oxide, or hafnium oxide can be integrated without problems using silicon process technology normally used in the fabrication of DRAMs. Further advantages of these dielectric layers of cerium oxide, zirconium oxide, and hafnium oxide are that they have a relatively low defect density, a high breakdown field strength of 10 MV/cm and above, and a high relative dielectric constant $\in_r$ of >20. Since, in addition, the NO-equivalent thickness of a dielectric layer of cerium oxide, zirconium oxide or hafnium oxide is low, these materials are of very great interest in particular for DRAMs of future generations.

Other features which are considered as characteristic for the invention are set forth in the appended claims.

Although the invention is illustrated and described herein as embodied in a capacitor for semiconductor configuration, and method for fabricating a dielectric layer therefor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
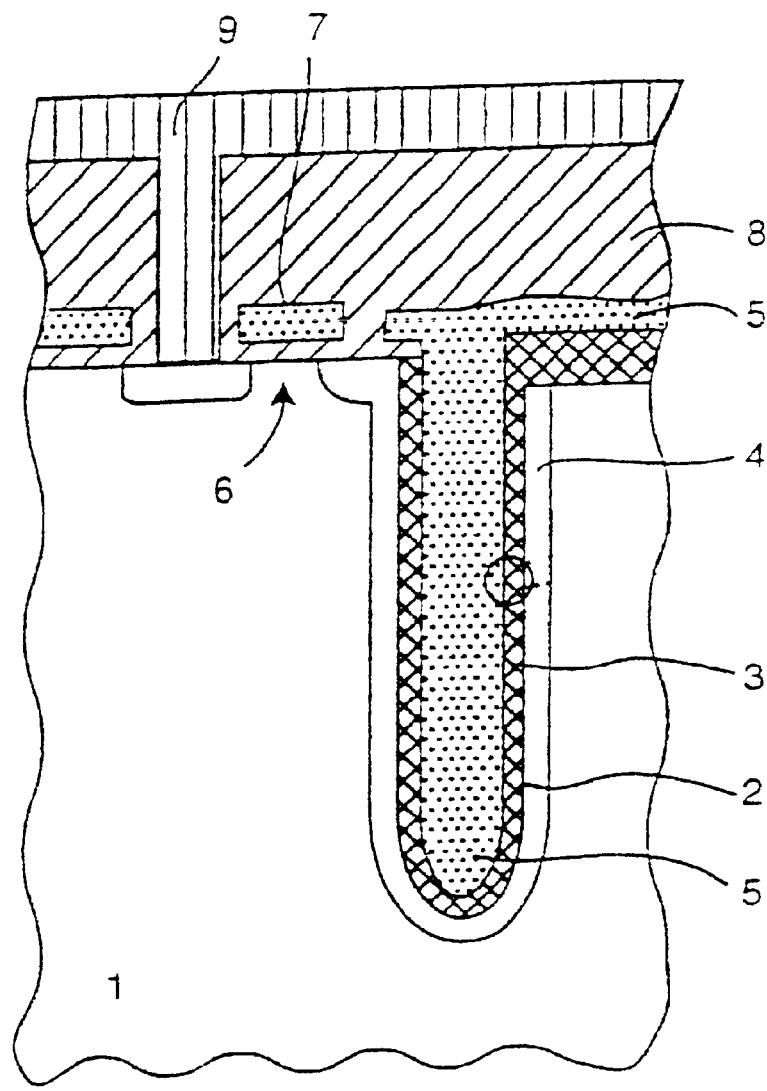
FIG. 1 shows a storage capacitor together with a transistor of a DRAM.
Figure 2:
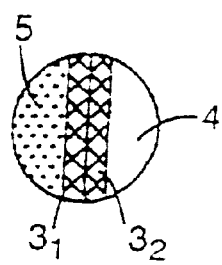
FIG. 2 shows a dielectric layer having two films.

Referring now to the figures of the drawing in detail and first, particularly, to FIG. 1 thereof, there is shown a p-conducting semiconductor body 1 having a trench 2 that can be made in the semiconductor body 1, for example, by etching. The surface of this trench 2 is covered with a dielectric layer 3 which consists of cerium oxide, zirconium oxide, or hafnium oxide. Individual films of these materials may also be selected for the dielectric layer 3. The dielectric layer 3 may include two or more films. FIG. 2 shows an enlarged region around a portion of the dielectric layer in which the dielectric layer has two films. For example, it is possible to provide a film $3_1$ of cerium oxide and a film $3_2$ of zirconium.

Furthermore, it is possible to provide a silicon nitride film with a layer thickness of 1 to 3 mm for one of these films.

The region of the semiconductor body 1 which adjoins the trench 2 consists of an $n^+$-conducting zone 4, while the interior of the trench 2 behind the dielectric layer 3 is filled with doped polycrystalline silicon 5.

The polycrystalline silicon 5 forms an electrode of a capacitor. The other electrode of the capacitor includes the highly doped zone 4. The dielectric layer 3 is located between these two electrodes.

Moreover, FIG. 1 also shows a transistor 6 with a gate electrode 7 made from $n^-$-conducting polycrystalline silicon that is embedded in an insulation layer 8 made of, for example, silicon dioxide and/or silicon nitride. A metallization 9 for the transistor 6 forms a bit line and consists of, for example, tungsten or aluminum.

Cerium oxide, zirconium oxide, or hafnium oxide can be integrated without problems using the conventional silicon process technology as it is used to fabricate the semiconductor configuration shown in FIG. 1. These materials are distinguished by a low defect density, a high breakdown field strength in the region of 10 MV/cm, and by a high relative dielectric constant of over 20.

The cerium oxide, zirconium oxide, or hafnium oxide may preferably also be stabilized with yttrium. A small amount of added yttrium is sufficient to achieve this effect. Doping with, for example, silicon or aluminum may be used in order to reduce bulk defects and to improve the interface with the silicon electrodes.

These dielectric layers of cerium oxide, zirconium oxide, or hafnium oxide can also be used in stacked DRAM cells, in which the capacitor lies above the transistor and the electrodes consist of highly doped polycrystalline silicon or of metal, such as for example, platinum or iridium.

In the semiconductor configuration shown in FIG. 1, the cerium oxide, zirconium oxide, or hafnium oxide for the dielectric layer 3 may be applied, for example, by means of a CVD process and the appropriate precursors, followed by conditioning in the range from 500° C. to 750° C. in an oxygen atmosphere. The precise temperatures depend on the layer thickness and on the desired properties of the dielectric layer 3.

We claim:

1. A capacitor for a semiconductor configuration, comprising:

two electrodes;

a dielectric layer located between said two electrodes, said dielectric layer made of an amount of a material selected from the group consisting of cerium oxide, zirconium oxide, and hafnium oxide; and a small amount of yttrium relative to said amount of said material of said dielectric layer, said yttrium stabilizing said material of said dielectric layer.

2. The capacitor according to claim 1, wherein said dielectric layer includes a plurality of films, and each one of said plurality of said films is made of a material selected from the group consisting of cerium oxide, zirconium oxide, and hafnium oxide.

3. The capacitor according to claim 1, wherein:

said dielectric layer includes a plurality of films;

at least one of said plurality of said films is made of a material selected from the group consisting of cerium oxide, zirconium oxide, hafnium oxide; and one of said plurality of said films is made of a material selected from the group consisting of silicon nitride and silicon oxide.

4. The capacitor according to claim 1, wherein:

said dielectric layer includes a plurality of films;

at least one of said plurality of said films is made of a material selected from the group consisting of cerium oxide, zirconium oxide, hafnium oxide; and one of said plurality of said films is made of silicon nitride and has a thickness of from 1 mm to 3 mm.

5. The capacitor according to claim 1, wherein said two electrodes consist of silicon.

6. The capacitor according to claim 1, comprising:

a substrate having a trench formed therein;

said two electrodes being laid in said trench.

7. The capacitor according to claim 1, wherein said two electrodes and said dielectric form a DRAM capacitor.

8. The capacitor according to claim 1, wherein said dielectric layer is additionally doped with a material selected from the group consisting of silicon and aluminum.

* * * * *